United States Patent
Ji et al.

(10) Patent No.: US 9,229,266 B2
(45) Date of Patent: Jan. 5, 2016

(54) LIQUID CRYSTAL DISPLAY DEVICE FOR DASHBOARD OF VEHICLE

(71) Applicant: LG DISPLAY CO., LTD., Seoul (KR)

(72) Inventors: SeungHoon Ji, Changwon-si (KR); MiKyung Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/554,690

(22) Filed: Nov. 26, 2014

(65) Prior Publication Data

US 2015/0153615 A1 Jun. 4, 2015

(30) Foreign Application Priority Data

Nov. 29, 2013 (KR) .................. 10-2013-0147734

(51) Int. Cl.
*G02F 1/1335* (2006.01)
*G03F 7/00* (2006.01)
*F21V 8/00* (2006.01)

(52) U.S. Cl.
CPC ........ *G02F 1/133514* (2013.01); *G02B 6/0051* (2013.01); *G02B 6/0073* (2013.01); *G02F 1/133603* (2013.01); *G03F 7/0007* (2013.01); *G02F 2001/133614* (2013.01); *G02F 2202/04* (2013.01)

(58) Field of Classification Search
CPC .... G02B 6/0073; G02B 6/0051; G02B 5/223; G02F 1/133603; G02F 1/133615; G02F 2001/133614; G02F 1/133514; G03F 7/0007
USPC .................... 430/7; 349/106, 65, 69
See application file for complete search history.

(56) References Cited

U.S. PATENT DOCUMENTS

| | | | |
|---|---|---|---|
| 4,863,522 A | 9/1989 | Jost et al. | |
| 2006/0082296 A1 | 4/2006 | Chua et al. | |
| 2012/0057098 A1 | 3/2012 | Lin et al. | |
| 2014/0140055 A1* | 5/2014 | Chen et al. .................. | 362/231 |

FOREIGN PATENT DOCUMENTS

| | | | |
|---|---|---|---|
| JP | 2003243715 A | | 8/2003 |
| JP | 2007277277 A | | 10/2007 |
| JP | 2009-151245 A | * | 7/2009 |
| JP | 2011059673 A | | 3/2011 |
| JP | 2012141368 A | | 7/2012 |
| JP | 2013199516 A | | 10/2013 |
| TW | 201211632 A1 | | 3/2012 |

OTHER PUBLICATIONS

Computer-generated translation of JP 2009-151245 (Jul. 2009).*
Wu, Hsien-Tsung et al.: "Nano-particles formation for pigment red 177 via a continuous supercritical anti-solvent process", Journal of Supercritical Fluids, PRA Press US, vol. 33, No. 2, Feb. 1, 2005, pp. 173-182, XP027818792.
Yang, Chih-Chieh et al.: "Highly stable three-band white light from an InGaN-based blue light-emitting diode chip precoated with (oxy)nitride green/red phosphors", Applied Physics Letters, American Institute of Physics, US, vol. 90, No. 12, Mar. 20, 2007, pp. 123503-123503, XP012093758.

* cited by examiner

*Primary Examiner* — John A McPherson
(74) *Attorney, Agent, or Firm* — Dentons US LLP (57) ABSTRACT

Disclosed is a liquid crystal display (LCD) device that may include a plurality of pixels; a liquid crystal layer disposed over the plurality of pixels; a red color filter layer disposed over the liquid crystal layer, the red color filter layer including anthraquinone pigment.

14 Claims, 5 Drawing Sheets

LIQUID CRYSTAL DISPLAY DEVICE FOR DASHBOARD OF VEHICLE

CROSS-REFERENCE TO RELATED APPLICATIONS

This application claims the benefit of the Korean Patent Application No. 10-2013-0147734, filed on Nov. 29, 2013, which is hereby incorporated by reference for all purposes as if fully set forth herein.

BACKGROUND OF THE INVENTION

1. Field of the Invention

The present invention relates to a liquid crystal display (LCD) device and method of manufacturing the same, and more particularly, an LCD device for a dashboard of a vehicle.

2. Discussion of the Related Art

In general, a dashboard of a vehicle displays basic information such as a speed of the vehicle, an RPM, an amount of fuel, a temperature of a coolant, a running distance, and the like. Recently, as the digital technology has been advanced, various other types of information such as a state of the vehicle, display of a rear side, navigation, and the like are displayed, along with the basic information of the vehicle.

In order to display these various types of information, a flat panel display device such as an LCD device is typically employed in a dashboard. However, an LCD device used as a display device for a dashboard may have the following problems.

As described above, a dashboard typically displays various types of information such as safety-related information, vehicle information, warning information, and the like. In such a case, the safety-related information is typically displayed in a green color, the information regarding the vehicle is displayed in a blue color, and the warning-related information is displayed in a red color. The warning-related information is displayed in a red color to increase visibility to the driver to draw his or her attention to thus protect the driver from a risk.

However, when an LCD device is used to display a red warning light, purity of the red color is lower relative to conventional dashboards using an LED, and such a lower visibility may fail to draw the driver's attention.

SUMMARY OF THE INVENTION

Accordingly, the present invention is directed to provide a liquid crystal display (LCD) device and method of manufacturing the same that substantially obviates one or more problems due to limitations and disadvantages of the related art.

An advantage of the present invention is to provide an LCD device that can be used for a dashboard of a vehicle with enhanced red color and luminance thereof.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an LCD device may, for example, include a plurality of pixels; a liquid crystal layer disposed over the plurality of pixels; a red color filter layer disposed over the liquid crystal layer, the red color filter layer including anthraquinone pigment.

The red color filter layer may include a photosensitive color resin, wherein the anthraquinone pigments are dispersed in the photosensitive color resin.

Furthermore, each anthraquinone pigment may have the chemical formula:

The liquid crystal display device may further include a color filter layer disposed over the liquid crystal layer. The color filter layer may include: the red color filter layer; a green color filter layer; and a blue color filter layer.

The liquid crystal display device may further include a backlight configured to provide light to the plurality of pixels.

The backlight may include a light source.

The light source may include at least one light emitting diode.

The at least one light emitting diode may include at least one white light emitting diode.

The at least one light emitting diode may include green fluorescence material and red fluorescence material. The green fluorescence material and the red fluorescence material may be mixed in a ratio in the range from about 1.5:1 to about 2.5:1, e.g. in the range from about 1.75:1 to about 2.25:1, e.g. about 2:1.

The liquid crystal display device may further include a plurality of gate lines and a plurality of data lines, wherein the plurality of pixels are defined by the plurality of gate lines and the plurality of data lines.

The anthraquinone pigment may have a pigment size in the range from about 50 μm to about 150 μm, e.g. in the range from about 70 μm to about 90 μm.

The red color filter layer may include an amount of the anthraquinone pigments in the range from about 40 wt % to about 45 wt %, preferably in the range from about 41 wt % to about 43 wt %.

The at least one light emitting diode is configured to emit light with a luminance in the range from about 25 lm to about 30 lm, preferably in the range from about 27 lm to about 28 lm.

In various embodiments, a warning light is provided. The warning light may include a liquid crystal display device as previously described.

In various embodiments, a dashboard is provided. The dashboard may include a liquid crystal display as previously described.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

In an exemplary embodiment of the present invention, a liquid crystal display (LCD) device used for a dashboard displays a red color with color purity and luminance level that are the same or higher than those of a light emitting diode (LED), which may enhance the visibility of warning signals to the driver and thus reduce or prevent an accident in advance.

Figure 1:
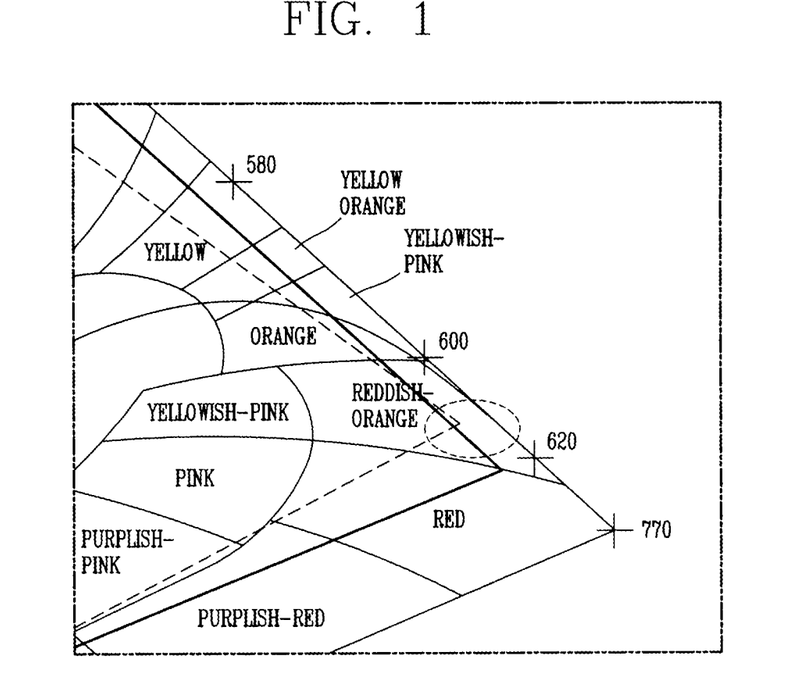
FIG. 1 is a view showing red color coordinates of a conventional liquid crystal display (LCD) device and an LED.

FIG. 1 is a view showing color coordinates in the red color of a conventional LCD device and an LED, in which the solid line represents the red color coordinates of the LED, while the dotted line represents the red color coordinates of the conventional LCD device.

As shown in FIG. 1, in case of an LED, z-coordinates, which represent the wavelength of a red color component, extend to z=620, and thus, in representing a red color, z-coordinates is z=620. In comparison, in case of an LCD device, z-coordinates extend to z=610, and thus, in representing a red color, z-coordinates is z=610. Thus, an LCD device is disadvantageous in implementing a deep red color compared to an LED. Substantially, when an LCD device implements its full red color, an actually displayed color is not a deep red color but an orange-red color.

In other words, when an LCD device is applied to a dashboard of a vehicle, when a warning light is implemented in a red color, a deep red color is not displayed but an orange-red is displayed. Of course, the driver while driving may recognize the warning light according to the display of the orange-red, but since the color is not deep red, recognition of the warning light may be delayed. The delay in recognition may result from difference in color as well as custom. This is because a dashboard of a vehicle, as an analog dashboard, has been used with a red light or a red LED, and because warning signs have been displayed with a deep red color. Thus, when the deep red color is displayed, drivers may instantly recognize warning signs, but in case of an orange-red color, rather than a deep red color, drivers may recognize warning signs with a lapse of time, rather than instantaneously. In case of a vehicle moving at a high speed, even a short difference in recognition may cause a serious problem.

Thus, when an LCD device according to an embodiment of the present invention is applied to a dashboard of a vehicle, a red color with the same or higher color purity and luminance level than those of the conventional LED can be implemented to thus allow the driver to recognize warning signals displayed on the dashboard in a short period of time.

Figure 2:
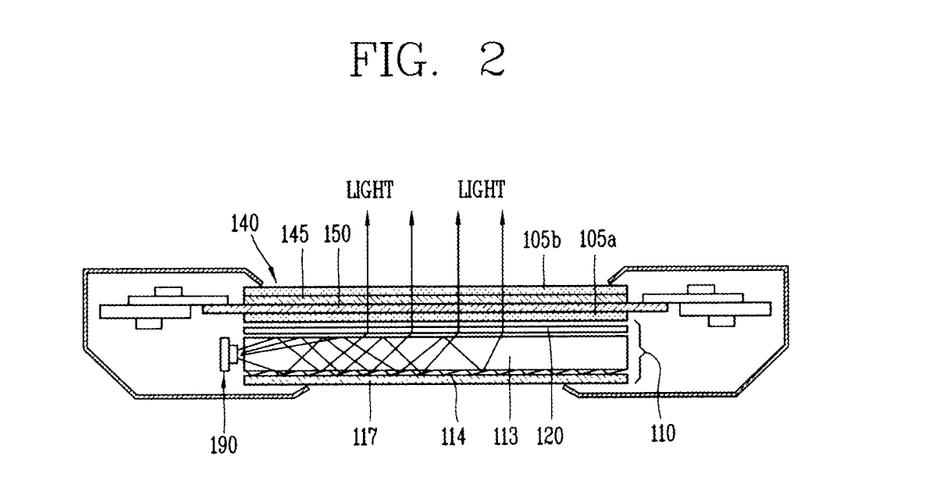
FIG. 2 is a cross-sectional view illustrating an LCD device according to an exemplary embodiment of the present invention.

FIG. 2 is a view illustrating a structure of an LCD device used for a dashboard according to an exemplary embodiment of the present disclosure.

As illustrated in FIG. 2, an LCD device 100 includes a liquid crystal display panel 140 and a backlight 110. In this embodiment, the backlight 110 is positioned below the liquid crystal display panel 140 to supply light to the liquid crystal display panel 140.

The backlight 110 includes a light source 190 for emitting light toward the liquid crystal display panel 140, a light guide plate 113 disposed below the liquid crystal display panel 140 to be facing with the light source 190 to supply the light emitted from the light source 190 through a lateral surface thereof to the liquid crystal display panel 140, a reflective plate 117 disposed below the light guide plate 113 to reflect the light incident through a lower side of the light guide plate 113 toward the liquid crystal display panel 140, and an optical sheet 120 disposed between the light guide plate 113 and the liquid crystal display panel 140 and composed of a diffusion plate for diffusing the light output from the light guide plate 113 and a prism sheet for condensing diffused light.

Also, a first polarizer 105a and a second polarizer 106b are respectively disposed at upper and lower sides of the liquid crystal display panel 140.

The light guide plate 113 guides the light input from the side thereof from one side to the other side, and outputs the light through an upper surface thereof toward the liquid crystal display panel 140. A pattern 114 is formed on a lower surface of the light guide plate 113, so that the light made incident on the pattern 114 is reflected and supplied to the liquid crystal display panel 140 through the upper surface of the light guide plate 113.

Although not shown in detail, the optical sheet 120 includes the diffusion plate for diffusing the light output from the light guide plate 113 and the prism sheet for condensing the light diffused by the diffusion sheet to allow the light to be uniformly supplied to the liquid crystal display panel 140. In this case, a single diffusion sheet may be provided, while the prism sheet may include a first prism sheet and a second prism sheet, which are vertically crossing in x,y-axis directions, to refract the light in the x,y-axis directions in order to enhance straightness of the light.

The light source 190 is provided on one side of the light guide plate 113, and after the light output from the light source is made incident on the light guide plate 113, it is supplied to the liquid crystal display panel 140. In FIG. 2, the light source 190 is formed on one side of the light guide plate 113, but the light source 190 may be disposed on both sides of the light guide plate 113 depending on a size of the liquid crystal display panel 140.

Figure 3A:
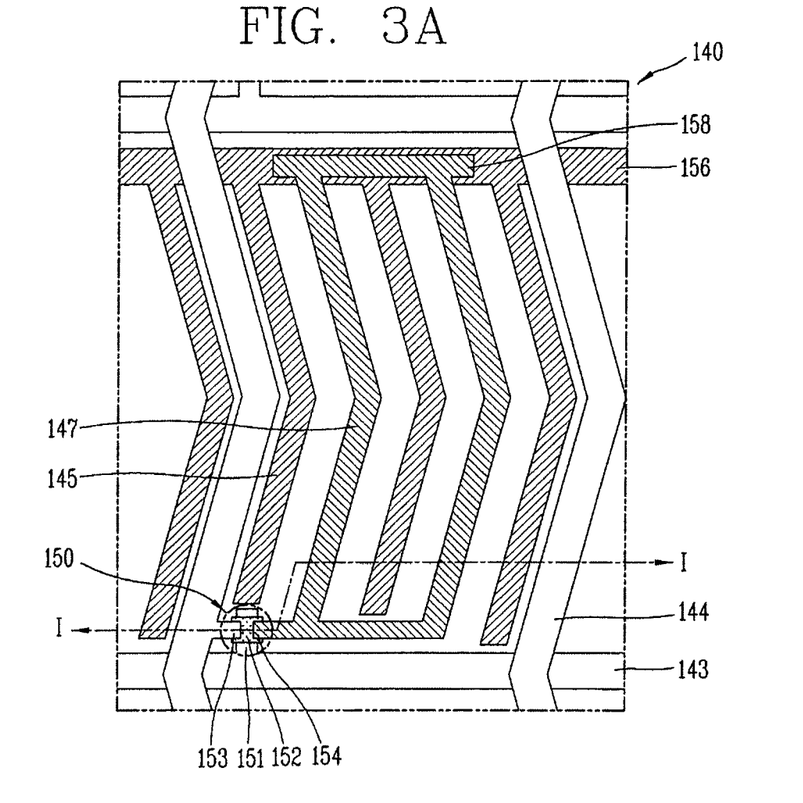
FIG. 3A is a plan view illustrating a liquid crystal display panel according to an exemplary embodiment of the present invention.
Figure 3B:
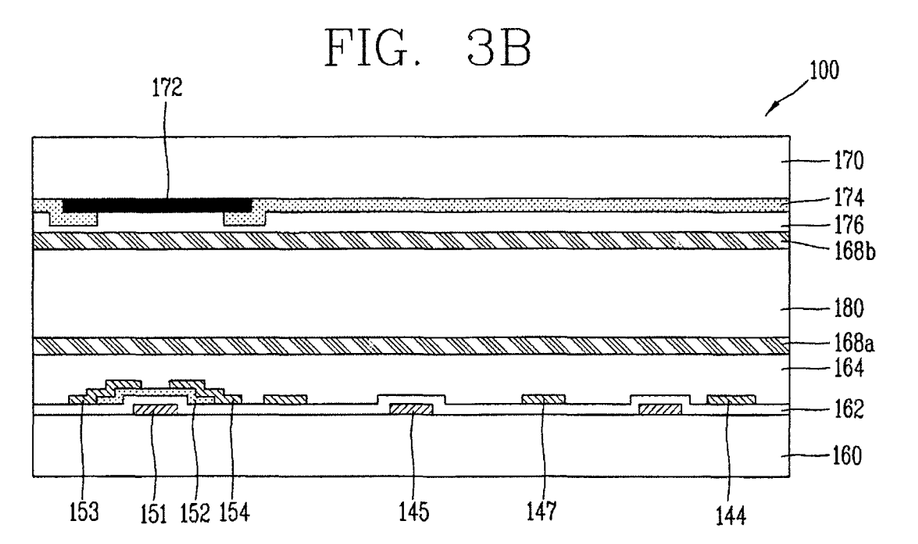
FIG. 3B is a cross-sectional view taken along line I-I in FIG. 3A.

FIG. 3 is a view illustrating a structure of a liquid crystal display panel. FIG. 3A is a plan view and FIG. 3B is a cross-sectional view taken along line I-I in FIG. 3A.

The liquid crystal display panel 140 illustrated in the drawings is an in-plane switching (IPS) mode liquid crystal display panel. However, the present invention is not limited to the IPS mode liquid crystal display panel. Those of ordinary skill in the art would understand that the principles of the present invention may also be applied to a twisted nematic (TN) mode liquid crystal display panel, a vertical alignment (VA) mode liquid crystal display panel, a fringe field switching (FFS) mode liquid crystal display panel, and the like. Hereinafter, the IPS mode liquid crystal display panel will be described as an example.

As illustrated in FIG. 3A, pixels of the liquid crystal display panel 140 are defined by gate lines 143 and data lines 144 disposed horizontally and vertically, respectively. Although only (n,m)th and (n,m+1)th pixels are displayed in the drawing for brevity, but the liquid crystal display panel 140 includes n number of gate lines 143 and m number of data lines 144 that form n×m number of pixels in an entire liquid crystal display panel 140.

A thin film transistor (TFT) 150 is formed near the crossing of the gate line 143 and the data line 144. The TFT 150 includes a gate electrode 151 to which a scan signal is applied from the gate line 143, a semiconductor layer 152 formed on the gate electrode 151 and forming a channel layer upon being activated by a scan signal applied thereto, and a source electrode 153 and a drain electrode 154 formed on the semiconductor layer 152, to which an image signal is applied through the data line 144, to apply an image signal input from the outside to a liquid crystal layer 180.

In each pixel, a plurality of common electrodes 145 and a plurality of pixel electrodes 147 are arranged to be substantially parallel to the data line 144. Also, a common line 156 connected to the common electrodes 145 is disposed in a middle of the pixel, a pixel electrode line 158 connected to the pixel electrode 157 is disposed on the common line 156 in an overlapping manner. Since the common line 156 and the pixel electrode line 158 overlap, a storage capacitor is formed in the IPS mode LCD device.

The common electrode 145 and the pixel electrode 147 are bent one time in a horizontal direction within the pixel. Since the common electrode 145 and the pixel electrode 147 are bent one time, upper and lower regions of the common electrode 145 and the pixel electrode 147 are substantially symmetrical in a horizontal direction with respect to a center of the pixel.

In the vertical IPS mode LCD device configured as described above, liquid crystal molecules are aligned to be substantially parallel to the common electrode 145 and the pixel electrode 147. When the TFT 150 operates to apply a signal to the pixel electrode 147, an in-plane field is generated to be substantially parallel to the liquid crystal display panel 140 between the common electrode 145 and the pixel electrode 147. Since the liquid crystal molecules are rotated to be parallel to the liquid crystal display panel 140 along the in-plane field, grayscale inversion due to optical anisotropy of the liquid crystal molecules may be prevented.

In this case, since the common electrode 145 and the pixel electrode 147 of the pixel are bent, directions of in-plane fields in the upper region and the lower region with respect to the central region of the pixel are symmetrical, and thus, liquid crystal molecules are arranged to be symmetrical in the upper region and the lower region. In this manner, since the liquid crystal molecules are arranged to be symmetrical in the single pixel, viewing angle directions are formed to be symmetrical within the single pixel to compensate for each other, and thus, viewing angle characteristics are enhanced.

Meanwhile, In FIG. 3A, the common electrode 145 and the pixel electrode 147 are bent, but the common electrode 145 and the pixel electrode 147 may be formed to be a straight line such that it is perpendicular to the gate line 143, rather than being bent.

The structure of the liquid crystal display panel will be described in more detail with reference to FIG. 3B.

As illustrated in FIG. 3B, the gate electrode 151 is formed on a first substrate 160, and a gate insulating layer 162 is stacked on an entire surface of the first substrate 160. A semiconductor layer 152 is formed on the gate insulating layer 162, and a source electrode 153 and a drain electrode 154 are formed on the semiconductor layer 152. Also, a passivation layer 164 is formed on an entire surface of the first substrate 160, and a first alignment layer 168a is formed on the passivation layer 164 to align liquid crystal molecules in a particular direction by an alignment method such as rubbing, or the like.

Also, a plurality of common electrodes 145 are formed on the first substrate 160, and a pixel electrode 147 and a data line 144 are formed on the gate insulating layer 162 to generate an in-plane field E between the common electrodes 145 and the pixel electrode 147.

In this case, all of the common electrodes 145 and the pixel electrode 147 may be formed on the first substrate 160 or may be formed on the gate insulating layer 162 and the passivation layer 164. Namely, the common electrodes 145 and the pixel electrode 147 may be formed on the same layer or on different layers.

A black matrix 172 and a color filter layer 174 are formed on a second substrate 170. The black matrix 172 serves to prevent leakage of light from a region in which liquid crystal molecules are not operated. As illustrated, the black matrix 172 is mainly formed in the TFT 150 region and a region between pixels (namely, gate line and data line region). The color filter layer 174 includes red (R), blue (B), and green (G) to implement actual colors. An overcoat layer 176 is formed on the color filter layer 174 to protect the color filter layer 174 and enhance smoothness of the substrate, and a second alignment layer 168b having a determined alignment direction is formed on the overcoat layer 176.

A liquid crystal layer 180 is formed between the first substrate 160 and the second substrate 170 to complete the liquid crystal display panel 140.

In the exemplary embodiment of the present invention, the liquid crystal display panel 140 can be applied to a dashboard of a vehicle, rather than to a TV or a portable electronic device, so a deep red color should be implemented, relative to a general liquid crystal display panel 140.

To this end, in the exemplary embodiment of the present invention, a deep red color is implemented with a material different from the one typically used for the R-color filter layer of a conventional LCD device.

Namely, an R-color filter layer is formed by using a photosensitive color resin having anthraquinone pigment dispersed therein having a chemical structural formula below.

[Chemical Formula 1]

The anthraquinone pigment have a size in a range from about 50 μm to about 150 μm, preferably in a range from about 70 μm to about 90 μm. Further, the red color filter layer 174 includes an amount of the anthraquinone pigment in a range from about 40 wt % to about 45 wt %, preferably in a range from about 41 wt % to about 43 wt %.

In a case of forming an R-color filter layer by dispersing diketopyrrolo-pyrrole (DDP) pigment having a structure of Chemical Formula 2 according to the related art, yellowish red or orangish red is implemented in color coordinates when implementing red. In contrast, in the case of using the anthraquinone pigment according to an embodiment of the present invention, a deep red color can be implemented.

[Chemical Formula 2]

Figure 4:
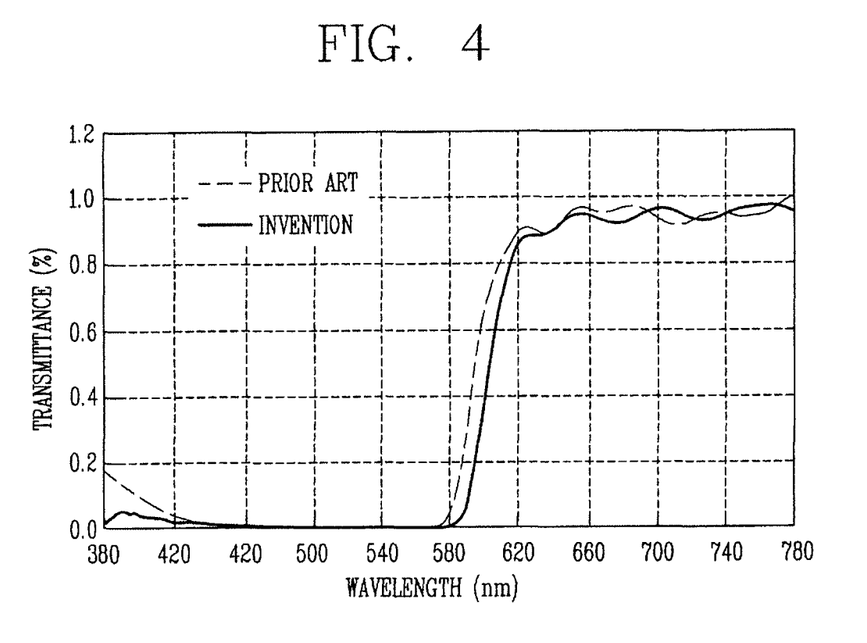
FIG. 4 is a graph showing spectrum characteristics of an R-color filter using a color resin having anthraquinone pigment dispersed therein and an R-color filter using a color resin having DDP pigment dispersed therein.

FIG. 4 is a graph showing spectrum characteristics of an R-color filter using a color filter having anthraquinone pigment dispersed therein and an R-color filter using a color resin having DDP pigment dispersed therein.

As shown in FIG. 4, in the case of using the R-color filter according to the exemplary embodiment of the present invention, the spectrum characteristics were shifted to the right side by approximately 10 nm, compared to the case of using the R-color filter having the conventional DDP pigment dispersed therein.

In general, red light has a wavelength ranging from 620 nm to 700 nm. In the case of the related art R-color filter having the DDP pigment, transmittance is increased from a wavelength below 620 nm, so it may be difficult to implement a deep red color. In contrast, in the case of the R-color filter according to the exemplary embodiment of the present invention in which the anthraquinone pigment was dispersed, since the spectrum characteristics are shifted to the right side by approximately 10 nm, transmittance is increased from a wavelength by more than 620 nm. As a result, a deep red color can be implemented.

Meanwhile, a white light emitting diode (W-LED) is mainly used as the light source 190 in the LCD device. The W-LED 190 supplies a white light to the liquid crystal display panel 140.

Figure 5:
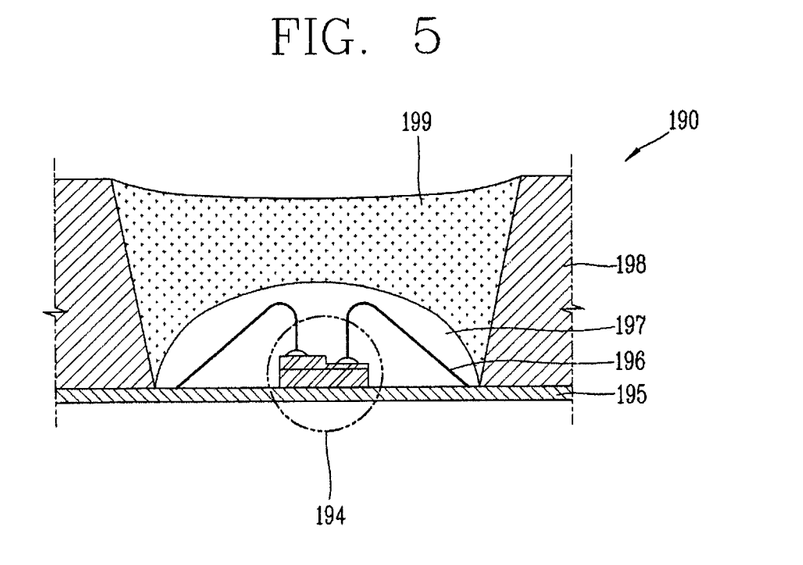
FIG. 5 is a cross-sectional view illustrating a structure of a W-LED according to an exemplary embodiment of the present invention.

FIG. 5 is a view illustrating a structure of a W-LED according to an exemplary embodiment of the present disclosure.

As illustrated in FIG. 5, the W-LED 190 includes an LED device 194 formed on a substrate 195 and a mold frame 198 for accommodating the LED device 194. A protective layer 199 is formed by filling an interior of the mold frame 198 corresponding to an upper side of the LED device 194 with a silicon epoxy, or the like to protect the LED device 194. In this case, a printed circuit board (PCB) may be used as the substrate 195. Also, although not shown, a static electricity preventing layer may be formed on a surface within or outside of the mold frame 198 to prevent generation of state electricity within the LED device 194.

Although not illustrated, the LED device 194 may include first semiconductor layers including a N-type semiconductor layer and a P-type semiconductor layer on a semiconductor substrate, and pads formed on the N-type semiconductor layer and the P-type semiconductor layer, respectively. The pads are electrically connected to the substrate 195 by wires 196, to which a signal is applied, and the LED device 194 is surrounded by a fluorescence layer 197.

The fluorescence layer 197 is formed of a fluorescence material having a color different from that of light emitted by the LED device 194, and absorbs a partial amount of the light made incident from the LED device 194 to output a mixed light (e.g., a white light).

The luminance of the light emitting diode is in a range from about 25 lm to about 30 lm, preferably in a range from about 27 lm to about 28 lm.

In the exemplary embodiment of the present invention, the LED device 194 emits a blue light, and the fluorescence layer 197 is formed as a layer including a mixture of a green fluorescence material and a red fluorescence material, whereby when the blue light is input from the LED device 194 to the fluorescence layer 197, a yellow light is emitted from the fluorescence layer 197, and as a result, the yellow light is mixed with the blue light emitted from the blue LED device 194 to become a white light, which is then output from the LED package 190.

The green fluorescence material and the red fluorescence material forming the fluorescence layer 197 are mixed in a ratio of about 1.5:1 to about 2.5:1, preferably 2:1. In a conventional W-LED, the green fluorescence material and the red fluorescence material are typically mixed by 1:1, but in the exemplary embodiment of the present invention, the green fluorescence material and the red fluorescence material are mixed in a ratio of 2:1, which will now be described in more detail.

In the color filter layer 174 of the liquid crystal display panel 140 according to the exemplary embodiment of the present disclosure, the R-color filter layer is formed of a color resin having anthraquinone pigment dispersed therein.

The R-color filter layer having the anthraquinone pigment is advantageous in that it can implement a deep red color, but may be disadvantageous in that luminance and aspect ratio may be degraded, compared to the R-color filter layer having DDP pigment dispersed therein. Thus, when the liquid crystal display panel having the R-color filter layer having the anthraquinone pigment is applied to a dashboard of a vehicle, the display quality may be degraded due to such a degradation of luminance and aspect ratio.

To address the above shortcomings of the R-color filter layer having the anthraquinone pigment, an LCD device according to another exemplary embodiment of the present invention provides the W-LED 190 to implement a deep red color, while guaranteeing luminance and aspect ratio substantially equal to those of the conventional LCD device.

Figure 6:
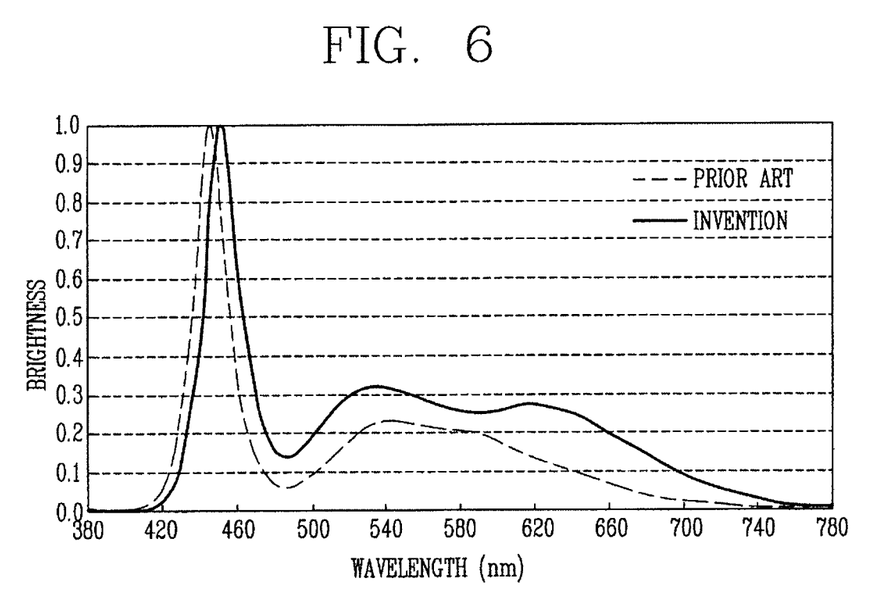
FIG. 6 is a graph showing luminance spectrums of a W-LED according to an exemplary embodiment of the present invention and a conventional W-LED.

FIG. 6 is a graph showing a luminance spectrum of the conventional W-LED in which the green fluorescence material and the red fluorescence material were mixed by a ratio of 1:1, along with a luminance spectrum the W-LED 190 in which the green fluorescence material and the red fluorescence material were mixed by a ratio of 2:1 in accordance with the exemplary embodiment. In FIG. 6, the solid line indicates the luminance spectrum of the W-LED according to the exemplary embodiment of the present invention, while the dotted line indicates the luminance spectrum of the conventional W-LED.

As shown in FIG. 6, the conventional W-LED and the W-LED according to the exemplary embodiment of the present invention have the substantially same luminance spectrum in a wavelength range from 440 to 460 nm (namely, a wavelength range of blue light, a short wavelength). In the middle and long wavelength ranges, the conventional W-LED shows a broad spectrum in the wavelength range from 530 to 620 nm without a peak, but in contrast, the W-LED according the exemplary embodiment of the present invention has peaks at wavelength ranges from 520 to 540 nm and from 620 to 630 nm.

In this case, because the wavelength ranges of 520 to 540 nm and 610 to 630 nm correspond to green light and red light, respectively, FIG. 6 indicates that the luminance of both the green light and the red light of the W-LED according to the exemplary embodiment of the present invention were increased, compared to the conventional W-LED. In other words, the W-LED according to the exemplary embodiment of the present invention has a luminance increased in the red light region, relative to the conventional W-LED.

Thus, by compensating for the lowered luminance of the red light using the W-LED 190, the LCD device the R-color filter layer of anthraquinone pigment according to the exemplary embodiment of the present invention may have luminance substantially equal or higher than that of the red light of the conventional LCD device.

The LCD device for a vehicle configured as described above displays information by implementing green, blue, and red colors depending on a type of information. In the exemplary embodiment of the present invention, the B-color filter layer of the LCD device may have pigment identical to that of the blue color filter layer of the conventional LCD device, implementing blue having purity and luminance substantially equal to those of the conventional LCD device. Similarly, the G-color filter layer may have pigment substantially identical to that of the green color filter layer of the con LCD device. But since the W-LED 190 has a higher peak value in the wavelength range of green light, a red color having purity substantially equal to that of the conventional LCD device may be implemented with enhanced luminance.

Also, because the R-color filter layer includes a pigment (e.g., anthraquinone pigment) capable of implementing a deep red color, relative to the R-color filter layer of the conventional LCD device, and because the W-LED having a higher peak value in the wavelength range of red light is used, the LCD device according to the exemplary embodiment of the present invention may realize a red color having enhanced purity and luminance compared to those of the conventional LCD device.

Thus, when a red warning sign, or the like, is implemented in a dashboard of a vehicle, color and luminance substantially identical to those of an analog dashboard using an LED may be implemented, and thus, the driver may quickly recognize the red warning sign, or the like.

In the above description, an LCD device having a particular structure is disclosed, but the present invention is not limited thereto. Those of ordinary skill in the art would understand that the principles of the present invention can be applied to an LCD device having a variety of structures and/or modes such as the IPS mode, TN mode, VA mode and FFS mode. As described above, according to an embodiment of the present invention, a color resin having anthraquinone pigment dispersed therein is used for the R-color filter layer and a W-LED, in which a green fluorescence material and a red fluorescence material is mixed by a ratio of 2:1, is used for the backlight source, leading to a deep red color with enhanced luminance.

Also, in the above description, an edge type backlight in which the W-LED is provided on the side of the light guide plate is disclosed, but other various types of backlight can be applied including a direct type backlight in which a W-LED having a green fluorescence material and a red fluorescence material mixed in a ratio of 2:1 is disposed below a light guide plate to allow a white light from a lower side of the light guide plate to be made incident on the light guide plate to supply the white light to a liquid crystal display panel or a backlight having a structure in which a W-LED is provided below a liquid crystal display panel to directly supply a white light to the liquid crystal display panel.

The foregoing embodiments and advantages are merely exemplary and are not to be considered as limiting the present invention. The principles of the present invention can be readily applied to other types of apparatuses. The foregoing description is intended to be illustrative, and not to limit the scope of the claims.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
a liquid crystal display panel including R, G, and B color filter layers to implement R, G, and B colors; and
a backlight having a white light emitting diode (W-LED) on the liquid crystal display panel, the W-LED including a blue light emitting diode (LED) for emitting a blue light and a fluorescence layer on the blue LED to supply a white light to the liquid crystal display panel,
wherein the R-color filter layer includes an anthraquinone pigment having a chemical formula as follows:

and
wherein the fluorescence layer includes a green fluorescence material and a red fluorescence material that are mixed in a ratio of about 1.5:1 to about 2.5:1.

2. The liquid crystal display device of claim 1, wherein the R-color filter layer includes a photosensitive color resin dispersed with the anthraquinone pigment.

3. The liquid crystal display device of claim 1, wherein the liquid crystal display panel comprises:
- a first substrate and a second substrate having a color filter layer;
- a plurality of gate lines and a plurality of data lines formed on the first substrate to define a plurality of pixel regions;
- a thin film transistor (TFT) formed in each of the pixel regions;
- a common electrode and a pixel electrode formed in each pixel region to form an electric field; and
- a liquid crystal layer formed between the first substrate and the second substrate.

4. The liquid crystal display device of claim 1, wherein a light emitted from the blue LED of the W-LED is absorbed in the fluorescence layer to emit a yellow light, and the yellow light is mixed with the blue light emitted from the blue LED to become the white light.

5. The liquid crystal display device of claim 1, wherein the green fluorescence material and the red fluorescence material are mixed in a ratio of 2 to 1.

6. The liquid crystal display device of claim 1, wherein the green fluorescence material and the red fluorescence material are mixed in a ratio of about 1.75:1 to about 2.25:1.

7. The liquid crystal display device of claim 1, wherein the anthraquinone pigment has a pigment size in a range from about 50 μm to about 150 μm.

8. The liquid crystal display device of claim 7, wherein the anthraquinone pigment has a pigment size in a range from about 70 μm to about 90 μm.

9. The liquid crystal display device of claim 1, wherein the R-color filter layer includes an amount of the anthraquinone pigment in a range from about 40 wt % to about 45 wt %.

10. The liquid crystal display device of claim 9, wherein the R-color filter layer includes an amount of the anthraquinone pigment in a range from about 41 wt % to about 43 wt %.

11. The liquid crystal display device of claim 1, wherein the backlight comprises:
- a light guide plate guiding white light made incident upon being emitted from the W-LED to the liquid crystal display panel;
- an optical sheet disposed above the light guide plate to diffuse and condense white light supplied to the liquid crystal display panel; and
- a reflective plate disposed below the light guide plate.

12. The liquid crystal display device of claim 11, wherein the W-LED is disposed on one side or on both sides of the light guide plate.

13. The liquid crystal display device of claim 11, wherein the W-LED is disposed below the light guide plate.

14. The liquid crystal display device of claim 1, wherein the W-LED is disposed below the liquid crystal display panel.

* * * * *